United States Patent
Miura et al.

(10) Patent No.: US 10,809,329 B2
(45) Date of Patent: Oct. 20, 2020

(54) MAGNETIC RESONANCE IMAGING APPARATUS AND GRADIENT MAGNETIC FIELD POWER SUPPLY DEVICE

(71) Applicant: TOSHIBA MEDICAL SYSTEMS CORPORATION, Otawara-Shi (JP)

(72) Inventors: Motohiro Miura, Yaita (JP); Masashi Hori, Nasushiobara (JP); Sho Kawajiri, Nasushiobara (JP)

(73) Assignee: TOSHIBA MEDICAL SYSTEMS CORPORATION, Otwara-shi (JP)

( * ) Notice: Subject to any disclaimer, the term of this patent is extended or adjusted under 35 U.S.C. 154(b) by 175 days.

(21) Appl. No.: 15/366,451

(22) Filed: Dec. 1, 2016

(65) Prior Publication Data
US 2017/0160358 A1    Jun. 8, 2017

(30) Foreign Application Priority Data

Dec. 4, 2015    (JP) .................................. 2015-237195

(51) Int. Cl.
*G01R 33/385*    (2006.01)
*G01R 33/54*    (2006.01)

(52) U.S. Cl.
CPC ........ *G01R 33/3852* (2013.01); *G01R 33/543* (2013.01)

(58) Field of Classification Search
CPC ................................................ G01R 33/3852
USPC ....................................................... 324/322
See application file for complete search history.

(56) References Cited

U.S. PATENT DOCUMENTS

| | | | | |
|---|---|---|---|---|
| 5,332,969 A * | 7/1994 | Tsuruno | ............. | G01R 33/3852 324/309 |
| 2011/0187370 A1* | 8/2011 | Hori | ....................... | G01R 33/44 324/318 |
| 2013/0009641 A1* | 1/2013 | Hori | ................... | G01R 33/3852 324/309 |

FOREIGN PATENT DOCUMENTS

| | | |
|---|---|---|
| JP | 06-254063 | 9/1994 |
| JP | 07-163540 | 6/1995 |
| JP | 2983256 | 9/1999 |

OTHER PUBLICATIONS

Office Action dated Sep. 3, 2019, in corresponding Japanese Patent Application No. 2015-237195, 43 pages.

* cited by examiner

*Primary Examiner* — Reena Aurora
(74) *Attorney, Agent, or Firm* — Oblon, McClelland, Maier & Neustadt, L.L.P.

(57) ABSTRACT

A magnetic resonance imaging apparatus according to a present embodiment includes a gradient magnetic field coil and a gradient magnetic field power supply. The gradient magnetic field coil applies gradient magnetic field to an object, the gradient magnetic field coil including a plurality of channels. The gradient magnetic field power supply calculates a required power for each channel, and distributes maximum power to a channel requiring higher power than the required power of other channels with priority to the other channels, the maximum power being a limit value of total power to be supplied to the channels as a whole.

13 Claims, 4 Drawing Sheets

MAGNETIC RESONANCE IMAGING APPARATUS AND GRADIENT MAGNETIC FIELD POWER SUPPLY DEVICE

CROSS-REFERENCE TO RELATED APPLICATION

This application is based upon and claims the benefit of priority from Japanese Patent Application No. 2015-237195, filed on Dec. 4, 2015, the entire contents of which are incorporated herein by reference.

FIELD

An embodiment as an aspect of the present invention relates to a magnetic resonance imaging apparatus and a gradient magnetic field power supply device.

BACKGROUND

A magnetic resonance imaging apparatus is an imaging apparatus which generates an MRI (Magnetic Resonance Imaging) image by exciting a nuclear spin of an object placed in a static magnetic field by an RF (Radio Frequency) signal of a Larmor frequency and reconstructing a magnetic resonance signal generated from the object with the excitation.

The magnetic resonance imaging apparatus includes a gradient magnetic field power supply device for distributing electric power to a gradient magnetic field coil on the basis of a pulse sequence. Using the gradient magnetic field power supply device, the gradient magnetic field coil can apply gradient magnetic fields in X-axis, Y-axis, and Z-axis directions to the object.

A problem to be solved by the present invention is to provide a magnetic resonance imaging apparatus and a gradient magnetic field power supply device which are able to improve use efficiency of electric power by the gradient magnetic field power supply device.

BRIEF DESCRIPTION OF THE DRAWINGS

In accompanying drawings.

DETAILED DESCRIPTION

Hereinafter, an embodiment of the present invention will be described on the basis of the attached drawings.

A magnetic resonance imaging apparatus according to the present embodiment includes a gradient magnetic field coil and a gradient magnetic field power supply. The gradient magnetic field coil applies gradient magnetic field to an object, the gradient magnetic field coil including a plurality of channels. The gradient magnetic field power supply calculates a required power for each channel, and distributes maximum power to a channel requiring higher power than the required power of other channels with priority to the other channels, the maximum power being a limit value of total power to be supplied to the channels as a whole.

Figure 1:
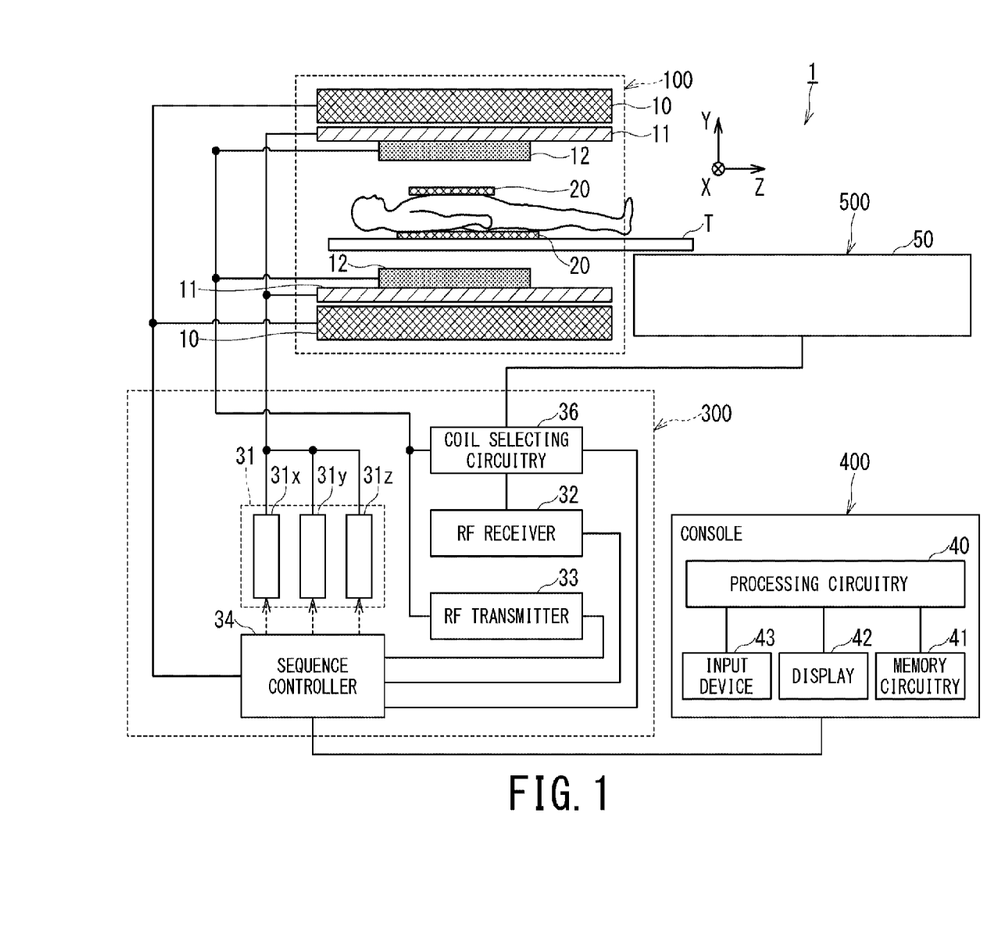
FIG. 1 is a block diagram illustrating entire constitution of a magnetic resonance imaging apparatus according to a present embodiment.

FIG. 1 is a block diagram illustrating entire constitution of a magnetic resonance imaging apparatus 1 according to a present embodiment.

The magnetic resonance imaging apparatus 1 includes a magnet rack 100, a bed 500, a control cabinet 300, a console 400, and an RF (Radio Frequency) coil 20.

The magnet rack 100 has a static magnetic field magnet 10, a gradient magnetic field coil 11, and a WB (Whole Body) coil 12 and these components are accommodated in a housing having a cylindrical shape. The bed 500 has a bed body 50 and a table-top T.

The control cabinet 300 includes a gradient magnetic field power supply device 31 (for X-axis 31x, for Y-axis 31y, and for Z-axis 31z), an RF receiver 32, an RF transmitter 33, a sequence controller 34, and coil selecting circuitry 36.

The console 400 includes processing circuitry 40, a memory circuitry 41, a display 42, and an input device 43. The console 400 functions as a host computer.

The static magnetic field magnet 10 of the magnet rack 100 has a substantially cylindrical shape and generates a static magnetic field in a bore into which an object or a patient, for example, is conveyed. The bore is a space inside a cylinder of the magnet rack 100. The static magnetic field magnet 10 incorporates a superconductive coil, and the superconductive coil is cooled to an extremely low temperature by liquid helium. The static magnetic field magnet 10 generates a static magnetic field by applying a current supplied from a power supply device for a static magnetic field in an excitation mode to the superconductive coil. When a mode changes to a permanent current mode after that, the power supply device for a static magnetic field is separated. Once the mode has changed to the permanent current mode, the static magnetic field magnet 10 continues to generate a large static magnetic field over a long period of time or for 1 year or more, for example.

The gradient magnetic field coil 11 has a substantially cylindrical shape similarly to the static magnetic field magnet 10 and is installed inside the static magnetic field magnet 10. The gradient magnetic field coil 11 applies a gradient magnetic field to the object by electric power supplied from the gradient magnetic field power supply device 31.

Since an eddy current generated with the generation of the gradient magnetic field interferes with imaging, an ASGC (Actively Shielded Gradient Coil) with a purpose of cancel and/or reduction of the eddy current may be used as the gradient magnetic field coil 11. The ASGC is a gradient magnetic field coil in which a shield coil for canceling and/or minimizing effect of the eddy current is provided on an outer side of a main coil for forming gradient magnetic fields in the X-axis, Y-axis, and Z-axis directions, respectively.

The WB coil 12 is also called a whole body coil and is installed substantially in a cylindrical shape so as to surround the object on an inner side of the gradient magnetic field coil 11. The WB coil 12 transmits an RF pulse transmitted from the RF transmitter 33 toward the object. On the other hand, the WB coil 12 receives a magnetic resonance signal emitted from the object by excitation of a hydrogen nucleus, that is, an MR (Magnetic Resonance) signal.

The magnetic resonance imaging apparatus 1 may include an RF coil 20 as illustrated in FIG. 1 in addition to the WB coil 12. The RF coil 20 is a coil placed in the vicinity of a body surface of the object. The RF coil 20 may include coil elements which will be described later. These coil elements are aligned in an array state inside the RF coil 20 and are called PAC (Phased Array Coil) in some cases. The RF coil 20 has several types. For example, the RF coil 20 has types such as a body coil (Body Coil) installed at a chest part, a belly part or a leg part of the object as illustrated in FIG. 1, a spine coil (Spine Coil) installed on a back side of the object and the like. Besides, the RF coil 20 has types such as a head coil (Head Coil) for imaging a head part of the object and a foot coil (Foot Coil) for imaging a foot and the like. Moreover, the RF coil 20 has types such as a wrist coil (Wrist Coil) for imaging a wrist, a knee coil (Knee Coil) for imaging a knee, a shoulder coil (Shoulder Coil) for imaging a shoulder and the like. Many of the RF coils 20 are coils exclusive for reception but some of the RF coils 20 are transmission/reception coils for conducting both transmission and reception. For example, the Head Coil and the Knee Coil as the RF coils 20 also include a transmission/reception coil.

The gradient magnetic field power supply device 31 includes the gradient magnetic field power supply devices 31$x$, 31$y$, and 31$z$ for each channel for driving each of the coils generating the gradient magnetic fields of the X-axis, the Y-axis, and the Z-axis. The gradient magnetic field power supply devices 31$x$, 31$y$, and 31$z$ independently output required current waveforms to each channel in accordance with an instruction of a sequence controller. As a result, the gradient magnetic field coil 11 can apply gradient magnetic fields in the X-axis, Y-axis, and Z-axis directions to the object. Constitution and actions of the gradient magnetic field power supply device 31 will be described later by using FIGS. 3 and 4.

The RF transmitter 33 generates an RF pulse on the basis of an instruction from the sequence controller 34. The generated RF pulse is transmitted to the WB coil 12 and applied to the object. By application of the RF pulse, an MR signal is generated from the object. This MR signal is received by the RF coil 20 or the WB coil 12.

The MR signal received by the RF coil 20 or more specifically, the MR signal received by each of the coil elements in the RF coil 20 is transmitted to the RF receiver 32 via the coil selecting circuitry 36. The coil selecting circuitry 36 selects the MR signal, output from the RF coil 20, or the MR signal, output from the WB coil 12, in accordance with a control signal output from the sequence controller 34 or the console 400.

The RF receiver 32 AD-converts the received MR signal and outputs it to the sequence controller 34. The MR signal which has been changed to a digital one is also called raw data in some cases.

The sequence controller 34 images the object by driving the gradient magnetic field power supply device 31, the RF transmitter 33, and the RF receiver 32, respectively, on the basis of control by the console 400. When raw data is received from the RF receiver 32 by imaging, the sequence controller 34 transmits the raw data to the console 400.

The sequence controller 34 includes processing circuitry (not shown). This processing circuitry is constituted by a processor for executing a predetermined program and hardware such as an FPGA (Field Programmable Gate Array), an ASIC (Application Specific Integrated Circuit) and the like, for example.

The bed body 50 of the bed 500 is capable of moving the table-top T in a vertical direction and a horizontal direction. Before imaging, the object placed on the table-top T is moved to a predetermined height. After that, the table-top T is moved in the horizontal direction, and the object is moved into the bore during imaging.

The console 400 includes processing circuitry 40, memory circuitry 41, a display 42, and an input device 43.

The processing circuitry 40 is a circuit including a CPU (Central Processing Unit) and an exclusive or general-purpose processor, for example. The processor realizes various functions which will be described later by executing various programs stored in the memory circuitry 41. The processing circuitry 40 may be constituted by hardware such as the FPGA and the ASIC. Moreover, the processing circuitry 40 can execute processing such as reconstruction of the raw data to a medical image, storage of the reconstructed image, calculation of statistic data from image values and the like by combining software processing by the processor and the programs and hardware processing.

The memory circuitry 41 includes a semiconductor memory element such as a RAM (Random Access Memory), a flash memory (Flash Memory) and the like, a hard disk, an optical disk and the like. The memory circuitry 41 may also include a portable media such as a USB (Universal Serial bus) memory, a DVD (Digital Video Disk) and the like. The memory circuitry 41 stores various processing programs used in the processing circuitry 40 (including not only an application program but also an OS (Operating System)), data required for executing the program, and medical images. Moreover, the OS may also include a GUI (Graphical User Interface) which uses many graphics in display of information of the display 42 for an operator so that basic operations can be carried out by the input device 43.

The display 42 is a display device such as a liquid crystal display panel, a plasma display panel, an organic EL panel and the like.

The input device 43 is a mouse, a keyboard, a trackball, a touch panel and the like, for example, and includes various devices for the operator to input various types of information and data.

Subsequently, a difference between: a constitution and actions of a gradient magnetic field power supply device according to a related-art; and the constitution and actions of the gradient magnetic field power supply device 31 according to the present embodiment will be described.

Figure 2:
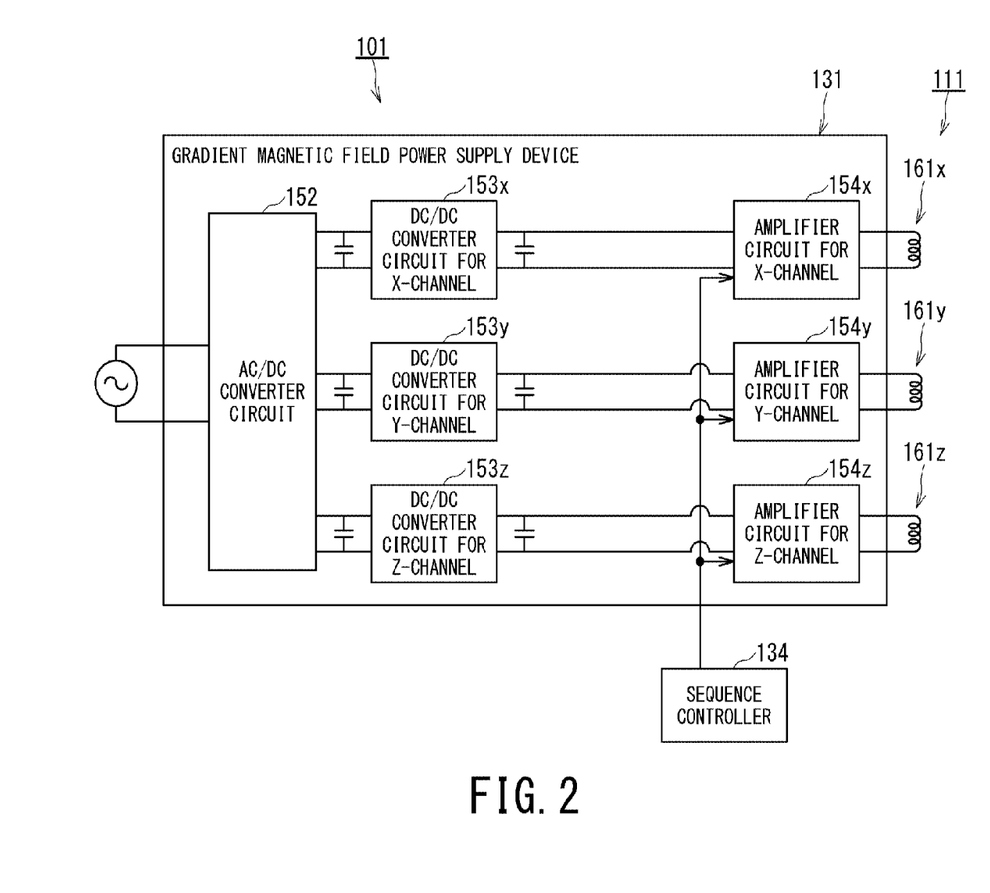
FIG. 2 is a view illustrating constitution of a gradient magnetic field power supply device according to a related-art.

FIG. 2 is a view illustrating constitution of the gradient magnetic field power supply device 101 according to the related-art.

FIG. 2 illustrates a gradient magnetic field coil 111, a gradient magnetic field power supply device 131, and a sequence controller 134. The gradient magnetic field power supply device 131 includes an AC/DC converter circuit 152 for conducting AC-DC conversion from a commercial power supply, three-channel DC/DC converter circuits 153$x$, 153$y$, 153$z$ having an insulated output and a conversion function of a DC voltage, respectively, and three-channel amplifier circuits 154$x$, 154$y$, and 154$z$ for causing an output current according to the instruction from the sequence controller to flow from their DC power supplies.

Figure 3:
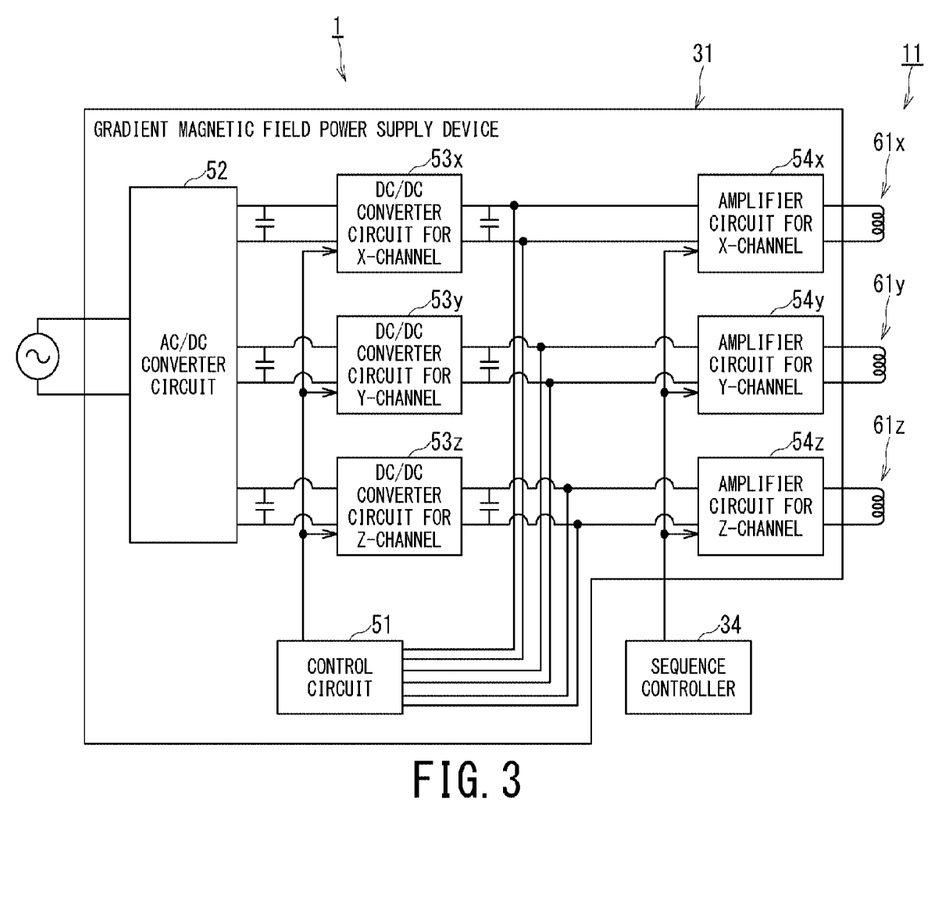
FIG. 3 is a view illustrating a first constitution example of the gradient magnetic field power supply device according to the present embodiment.
Figure 4:
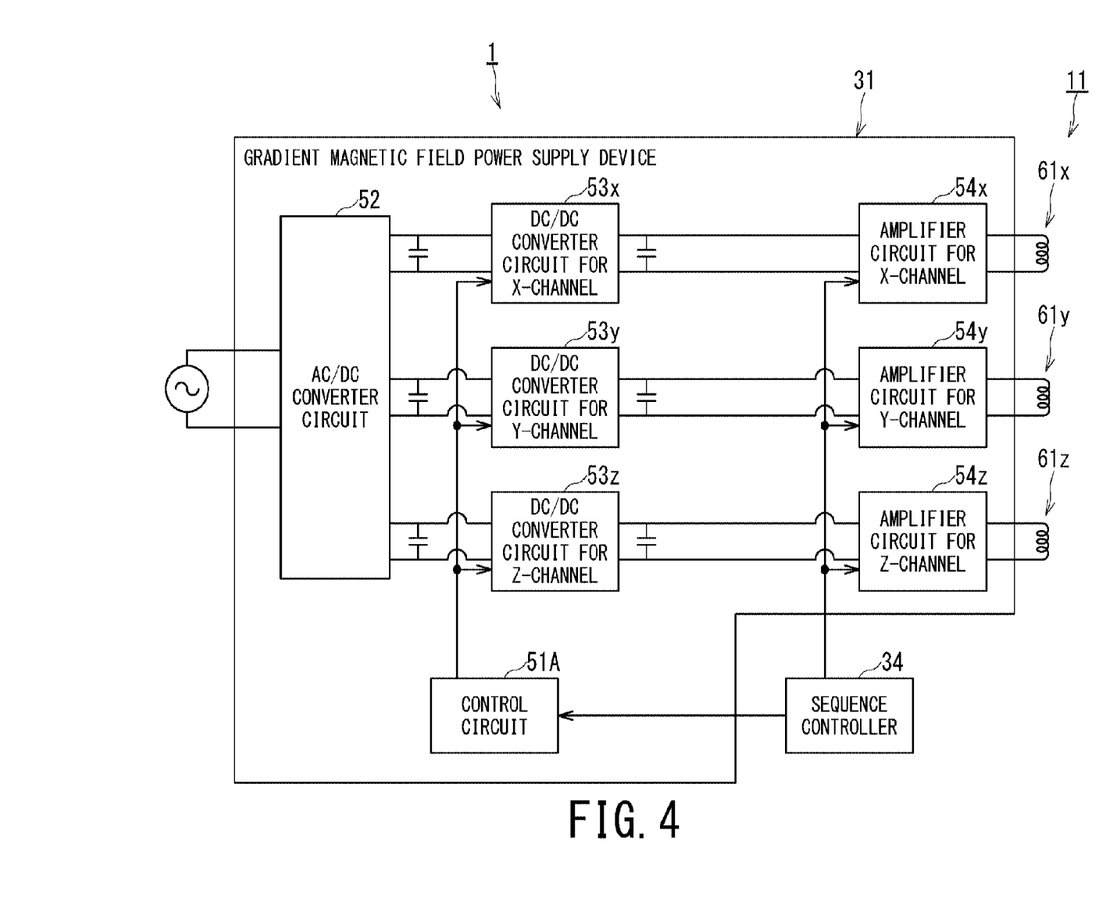
FIG. 4 is a view illustrating a second constitution example of the gradient magnetic field power supply device according to the present embodiment.

The gradient magnetic field coil 111 includes an X-channel 161$x$ connected to the amplifier circuit 154$x$ for the X-channel, a Y-channel 161$y$ connected to the amplifier circuit 154$y$ for the Y-channel, and a Z-channel 161$z$ connected to the amplifier circuit 154$z$ for the Z-channel. In FIGS. 2 to 4, the "channel" is expressed by "ch".

Assuming that maximum output power of the DC/DC converter circuits 153$x$, 153$y$, and 153$z$ is constant, capacitors on their subsequent stages keep constant voltage up to the maximum power. However, if supply power to the gradient magnetic field coils 161x, 161y, and 161z of each channel exceeds the maximum output power of the DC/DC converter circuit, the voltages of the capacitors begin to lower. In general, magnitudes of power of the gradient magnetic field coils 161x, 161y, and 161z of each channel required during the imaging are largely different. That is, in the case of the related-art, since the gradient magnetic field power supply device 101 does not control a distribution ratio of the power to the three channels 161x, 161y, and 161z, the power is not sufficient to a required power (a required power amount) in the DC/DC converter circuit corresponding to the channel with a large load in the DC/DC converter circuits 153x, 153y, and 153z, and the voltage of the capacitor lowers first. When the lowering of the voltage in the capacity becomes large, the current waveform instructed by the sequence controller cannot be obtained any more, which gives a bad influence to an obtained image and moreover, the gradient magnetic field power supply is stopped in the end.

Thus, the magnetic resonance imaging apparatus 1 according to the present embodiment has constitution of distributing the power to each channel in accordance with the required power of each channel of the gradient magnetic field coil 111. Specifically explaining by using FIGS. 3 and 4, the magnetic resonance imaging apparatus 1 has constitution of calculating a required power for each of the channels 61x, 61y and 61z, and distributing maximum power of the gradient magnetic field power supply device 31 to a channel requiring higher power than the required power of other channels with priority to the other channels. The maximum power of the gradient magnetic field power supply device 31 is a limit value (limit) of total power to be supplied to the channels as a whole. The maximum power of the gradient magnetic field power supply device 31 is specified in advance from a power capacity of the gradient magnetic field power supply device 31. Thus, even if the total sum of the required power of the X-channel 61x, the required power of the Y-channel 61y, and the required power of the Z-channel 61z exceeds the power capacity of the gradient magnetic field power supply device 31, the maximum power of the gradient magnetic field power supply device 31 does not change. FIG. 3 illustrates a first constitution example of the gradient magnetic field power supply device 31 and FIG. 4 illustrates a second constitution example of the gradient magnetic field power supply device 31.

FIG. 3 is a view illustrating the first constitution example of the gradient magnetic field power supply device 31 according to the present embodiment.

FIG. 3 illustrates the gradient magnetic field coil 11, the gradient magnetic field power supply device 31, and the sequence controller 34. The gradient magnetic field power supply device 31 includes a control circuit 51, an AC/DC converter circuit 52, DC/DC converter circuits corresponding to the channels, and amplifier circuits corresponding to the channels. The gradient magnetic field coil 11 includes an X-channel 61x connected to an amplifier circuit 54x for an X-channel, a Y-channel 61y connected to an amplifier circuit 54y for a Y-channel, and a Z-channel 61z connected to an amplifier circuit 54z for a Z-channel.

As the DC/DC converter circuits, a DC/DC converter circuit 53x for the X-channel, a DC/DC converter circuit 53y for the Y channel, a DC/DC converter circuit 53z for the Z-channel are exemplified. Similarly, as the amplifier circuits, the amplifier circuit 54x for the X-channel connected to the DC/DC converter circuit 53x for the X-channel, the amplifier circuit 54y for the Y-channel connected to the DC/DC converter circuit 53y for the Y-channel, and the amplifier circuit 54z for the Z-channel connected to the DC/DC converter circuit 53z for the Z-channel are included.

The gradient magnetic field power supply device 31x illustrated in FIG. 1 corresponds to the AC/DC converter circuit 52, the DC/DC converter circuit 53x for the X-channel, and the amplifier circuit 54x for the X-channel illustrated in FIG. 3. The gradient magnetic field power supply device 31y illustrated in FIG. 1 corresponds to the AC/DC converter circuit 52, the DC/DC converter circuit 53y for the Y-channel, and the amplifier circuit 54y for the Y-channel illustrated in FIG. 3. The gradient magnetic field power supply device 31z illustrated in FIG. 1 corresponds to the AC/DC converter circuit 52, the DC/DC converter circuit 53z for the Z-channel, and the amplifier circuit 54z for the Z-channel illustrated in FIG. 3.

The AC/DC converter circuit 52 generates a DC voltage from an AC voltage of a commercial AC power supply facility. The AC/DC converter circuit 52 converts the AC voltage to a DC voltage and boosts the converted DC voltage. The AC/DC converter circuit 52 rectifies the commercial power supply and makes it to a required voltage and then, charges electric energy to the capacitor on the subsequent stage.

The DC/DC converter circuits 53x, 53y, and 53z convert the DC voltage converted by the AC/DC converter circuit 52 to an AC voltage by using a chopper circuit or the like, convert the AC voltage to a required voltage by insulation using a transformer, and rectify an output of the transformer so as to obtain a stabilized DC voltage.

Each of the amplifier circuits 54x, 54y, and 54z is a current source type amplification circuit for generating a required output current from the aforementioned DC voltage by using a PWM (Pulse Width Modulation) inverter circuit. The amplifier circuits 54x, 54y, and 54z are current source type amplification circuits for causing currents determined by the type of the pulse sequence selected by the console 400 (illustrated in FIG. 1) to flow in order to generate a magnetic field giving position information of the X-axis, the Y-axis, and the Z-axis to the MR signal. The amplifier circuits 54x, 54y, and 54z execute control so that the currents flowing through the channels 61x, 61y, and 61z match current waveforms according to the pulse sequence from the sequence controller 34 when supplying the currents to the channels 61x, 61y, and 61z of the gradient magnetic field coil 11, respectively.

As the type of the pulse sequence, there can be a pulse sequence indicating imaging for obtaining a positioning image, a pulse sequence for generating a sensitivity map of the RF coil, a pulse sequence indicating imaging for obtaining a T1 highlight (T1W) image, a pulse sequence indicating imaging for obtaining T2 highlight (T2W) image and the like.

The three channels 61x, 61y, and 61z receive pulse currents from the amplifier circuits 54x, 54y, and 54z, respectively, and apply the gradient magnetic fields in directions of the X-axis, the Y-axis, and the Z-axis to the object.

Since the gradient magnetic field power supply device 31 needs to obtain a large voltage due to its characteristics of causing a pulse current to flow through the coil, amplifier circuits in which PWM inverter circuits are connected in series are used as the amplifier circuits 54x, 54y, and 54z. In this case, since the PWM inverter circuits are connected in series, electrically insulated DC power supplies are required individually. In order to obtain the insulated DC power supplies, it is assumed that switching circuits insulated by transformers are used as the DC/DC converter circuits 53x, 53y, and 53z, and outputs according to the number of serial power supplies inside the respective amplifier circuits are obtained. However, this case is not limiting.

If the switching circuit is used for the DC power supply as described above, a boosting type converter is assumed to be used as the AC/DC converter circuit 52. However, this case is not limiting.

The control circuit 51 executes control such that the power is distributed to each channel in accordance with the power required in each channel of the gradient magnetic field coil 11. The control circuit 51 calculates the required power of each channel from a load of each channel, that is, a voltage of each capacitor on the subsequent stage of each of the DC/DC converter circuits 53$x$, 53$y$, and 53$z$. The control circuit 51 receives information of the voltages from the capacitors on the subsequent stages of the DC/DC converter circuits 53$x$, 53$y$, and 53$z$, respectively, and executes control such that a distribution ratio of the power to the channel corresponding to the DC/DC converter circuit with a lower voltage is increased, while the distribution ratios to the other channels are lowered. For example, the control circuit 51 increases the distribution ratio of the power to the channel corresponding to the DC/DC converter circuit with the lower voltage by prolonging operation time of the DC/DC converter circuit. On the other hand, the control circuit 51 lowers the distribution ratios of power to the other channels corresponding to the DC/DC converter circuits with the higher voltages by shortening the operation time of the DC/DC converter circuits.

In order to achieve the purpose of improvement of use efficiency of power by the gradient magnetic field power supply device 31, if the total sum of the required power of the X-channel 61$x$, the required power of the Y-channel 61$y$, and the required power of the Z-channel 61$z$ is not larger than a predetermined threshold value, it is not necessary to supply power with priority to the channel with the higher required power corresponding to the DC/DC converter circuit with the lower voltage. Here, the predetermined threshold value is determined by a relationship with the maximum power of the gradient magnetic field power supply device 31. That is, the control circuit 51 executes control such that, if the total sum exceeds the predetermined threshold value, the power is supplied with priority to the channel with a higher required power.

The control circuit 51 consecutively adjusts the distribution ratio in accordance with a load of each of the three channels 61$x$, 61$y$, and 61$z$ of the gradient magnetic field coil 11 during imaging in accordance with the pulse sequence such that the ratio of power becomes higher to the channel with a large load, that is, the channel corresponding to the DC/DC converter circuit with the lower voltage. Thus, in the gradient magnetic field power supply device 31, during the imaging in accordance with the pulse sequence, time during which driving can be carried out with constant input power is increased. As a result, an effect of improving use efficiency of power can be obtained.

In particular, according to the control circuit 51, since the distribution ratio of power is calculated as the required power of each channel on the basis of the information of the voltage of the capacitor, the required power of the channel can be determined by internal processing of the gradient magnetic field power supply device 31.

FIG. 4 is a view illustrating the second constitution example of the gradient magnetic field power supply device 31 according to the present embodiment.

FIG. 4 illustrates the gradient magnetic field coil 11, the gradient magnetic field power supply device 31, and the sequence controller 34. The gradient magnetic field power supply device 31 includes a control circuit 51A, the AC/DC converter, the DC/DC converter circuits corresponding to the channels, and the amplifier circuits corresponding to the channels.

As the DC/DC converter circuits, the DC/DC converter circuit 53$x$ for the X-channel, the DC/DC converter circuit 53$y$ for the Y-channel, and the DC/DC converter circuit 53$z$ for the Z-channel are exemplified. Similarly, as the amplifier circuits, the amplifier circuit 54$x$ for the X-channel connected to the DC/DC converter circuit 53$x$ for the X-channel, the amplifier circuit 54$y$ for the Y-channel connected to the DC/DC converter circuit 53$y$ for the Y-channel, and the amplifier circuit 54$z$ for the Z-channel connected to the DC/DC converter circuit 53$z$ for the Z-channel are included. In FIG. 4, same reference numerals are given to same members as those illustrated in FIG. 3, and the explanation will be omitted.

The control circuit 51A executes control such that the power is distributed to each channel in accordance with the required power of each channel of the gradient magnetic field coil 11. The control circuit 51A receives the pulse sequence from the sequence controller 34 and calculates the required power of each channel from the type of the pulse sequence. The control circuit 51A executes control such that the distribution ratio of power corresponding to the type of the pulse sequence is obtained. Specifically, in the case of the type of pulse sequence in which a load of the X-channel 61$x$ is expected to be the maximum and a load of the Z-channel 61$z$ is expected to be the minimum, the control circuit 51A executes control such that the distribution ratio of the power to the X-channel 61$x$ becomes the maximum, and the distribution ratio of the power to the Z-channel 61$z$ becomes the minimum. For example, the control circuit 51A increases the distribution ratio of the power to the channel 61$x$ by prolonging the operation time of the DC/DC converter circuit 53$x$. On the other hand, the control circuit 51A lowers the distribution ratio of power to the channel 61$z$ by shortening the operation time of the DC/DC converter circuit 53$z$.

In order to achieve the purpose of improvement of use efficiency of power by the gradient magnetic field power supply device 31, if the total sum of the required power of the X-channel 61$x$, the required power of the Y-channel 61$y$, and the required power of the Z-channel 61$z$ is not larger than a predetermined threshold value, it is not necessary to supply power with priority to the channel with the maximum load and the higher required power. That is, the control circuit 51A executes control such that, if the total sum exceeds the predetermined threshold value, the power is supplied with priority to the channel with the higher required power.

A relation between the types of the pulse sequence and the distribution ratio of the power corresponding to each type may be registered in advance as a correspondence table. If the pulse sequences are selected by the console 400 so as to successively carry out the pulse sequences in one test, the distribution ratio of power may be set only once prior to the test or the distribution ratio of power may be set in plural times prior to each pulse sequence in the one test.

The control circuit 51A makes settings in advance such that the power of the DC/DC converter circuit corresponding to the channel with the large load has a high distribution ratio in accordance with the type of the pulse sequence from the sequence controller 34 before start of imaging according to the pulse sequence. Then, during the imaging according to the pulse sequence, the power is distributed to the channels 61$x$, 61$y$, and 61$z$ in accordance with the set distribution ratio. Thus, in the gradient magnetic field power supply device 31, a phenomenon of turning-down of the DC/DC converter circuit during the imaging according to the pulse sequence is suppressed.

In particular, according to the control circuit 51A, since the distribution ratio of power is calculated as the required power of each channel on the basis of the type of the pulse sequence, the required power of each channel can be estimated before the imaging.

Moreover, since the control circuit 51A obtains current waveform information of the pulse sequence, the power required by each channel at that time can be also obtained by calculating a sum of: the power calculated from a product of an impedance and a square of a current value in each channel of the gradient magnetic field coil; and a power loss of the amplifier circuit in proportion to the current. The effect similar to the above can be obtained also by supplying the power with priority from the DC/DC converter circuit of the channel requiring the power in the three channels.

According to the magnetic resonance imaging apparatus and the gradient magnetic field power supply device of at least one embodiment described above, use efficiency of the power by the gradient magnetic field power supply device is improved.

For example, the constitution and action of the gradient magnetic field power supply device 31 illustrated in FIG. 3 and the constitution and action of the gradient magnetic field power supply device 31 illustrated in FIG. 4 may be combined. In this case, during the imaging carried out while the power is distributed to each channel at the distribution ratio set in advance in accordance with the type of the pulse sequence, the distribution ratio of power is consecutively adjusted in accordance with the load of each channel.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a gradient magnetic field coil configured to apply gradient magnetic field to an object, the gradient magnetic field coil including a plurality of channels; and
a gradient magnetic field power supply configured to calculate a required power for each channel, and distribute maximum power to a channel requiring higher power than the required power of other channels, the maximum power being a limit value of total power to be supplied to the plurality of channels, wherein
the gradient magnetic field power supply includes:
an AC/DC conversion circuit configured to convert an AC voltage to a DC voltage;
DC/DC converiosn circuits configured to convert the DC voltage, the DC/DC conversion circuits corresponding to the plurality of channels; and
a control circuit configured to distribute the maximum power to the channel requiring higher power than the required power of the other channels based on the required power of each of the plurality of channels.

2. The apparatus according to claim 1, wherein
the control circuit is further configured to calculate the required power based on a voltage of a capacitor included in the DC/DC converion circuits.

3. The apparatus according to claim 1, wherein
the control circuit is further configured to calculate the required power based on information of a pulse sequence for imaging the object.

4. The apparatus according to claim 1, wherein
the control circuit is further configured to distribute the maximum power to the channel requiring higher power than the required power of the other channels when a total sum of the required power exceeds a predetermined threshold value.

5. The apparatus according to claim 1, wherein
the gradient magnetic field coil includes a main coil configured to form the gradient magnetic field, and a shield coil configured to cancel and/or minimize effect of eddy current.

6. A gradient magnetic field power supply device comprising:
a control circuit configured to:
calculate a required power for each of a plurality of channels included in a gradient magnetic field coil of a magnetic resonance imaging apparatus; and
distribute maximum power to a channel requiring higher power than the required power of other channels, the maximum power being a limit value of total power to be supplied to the plurality of channels, the gradient magnetic field power supply device further comprising:
an AC/DC conversion circuit configured to convert an AC voltage to a DC voltage; and
DC/DC conversion circuits configured to convert the DC voltage, the DC/DC conversion circuits corresponding to the plurality of channels.

7. The device according to claim 6, wherein
the control circuit is further configured to calculate the required power based on a voltage of a capacitor included in the DC/DC conversion circuits.

8. The device according to claim 6, wherein
the control circuit is further configured to calculate the required power based on information of a pulse sequence for imaging an object by the magnetic resonance imaging apparatus.

9. The device according to claim 6, wherein
the control circuit is further configured to distribute the maximum power to the channel requiring higher power than the required power of the other channels when a total sum of the required power exceeds a predetermined threshold value.

10. A gradient magnetic field power supply device comprising:
an AC/DC conversion circuit configured to convert an AC voltage to a DC voltage;
DC/DC conversion circuits configured to convert the DC voltage, the DC/DC conversion circuits corresponding to channels included in a gradient magnetic field coil; and
a control circuit configured to control the DC/DC conversion circuits such that a total power to be supplied to the plurality of channels is distributed with a first channel receiving priority over a second channel other than the first channel based on voltages of respective capacitors arranged subsequent to each of the DC/DC conversion circuits, the voltage of the capacitor corresponding to the first channel being lower, before the control, than the voltage of the capacitor corresponding to the second channel.

11. The device according to claim 10, wherein
the control circuit is further configured to calculate the required power based on information of a pulse sequence for imaging an object by the magnetic resonance imaging apparatus.

12. The device according to claim 10, wherein
a power distributed to the channel other than the one channel is lower, after the control, than a power distributed to the channel other than the one channel before the control.

13. The device according to claim 10, wherein
a power distributed to the one channel is higher, after the control, than a power distributed to the one channel before the control.

\* \* \* \* \*

UNITED STATES PATENT AND TRADEMARK OFFICE
CERTIFICATE OF CORRECTION

PATENT NO.       : 10,809,329 B2
APPLICATION NO.  : 15/366451
DATED            : October 20, 2020
INVENTOR(S)      : Motohiro Miura et al.

It is certified that error appears in the above-identified patent and that said Letters Patent is hereby corrected as shown below:

On the Title Page

Item (73), the Assignee's city is incorrect. Item (73) should read:
-- (73) Assignee: TOSHIBA MEDICAL SYSTEMS CORPORATION, Otawara-shi (JP) --

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*

UNITED STATES PATENT AND TRADEMARK OFFICE
CERTIFICATE OF CORRECTION

PATENT NO. : 10,809,329 B2
APPLICATION NO. : 15/366451
DATED : October 20, 2020
INVENTOR(S) : Motohiro Miura et al.

Page 1 of 1

It is certified that error appears in the above-identified patent and that said Letters Patent is hereby corrected as shown below:

On the Title Page

Item (73), should read:
-- (73) Assignee: CANON MEDICAL SYSTEMS CORPORATION, Otawara-shi (JP) --

Signed and Sealed this
Thirteenth Day of September, 2022

Katherine Kelly Vidal
*Director of the United States Patent and Trademark Office*